(12) United States Patent
Jones

(10) Patent No.: US 10,002,980 B1
(45) Date of Patent: Jun. 19, 2018

(54) PROCESS FOR MANUFACTURE OF MONO- OR POLYCRYSTALLINE SILICON PANELS WITH ANNEALED METAL LAYER

(71) Applicant: Matthew S. Jones, West Jordan, UT (US)

(72) Inventor: Matthew S. Jones, West Jordan, UT (US)

( * ) Notice: Subject to any disclaimer, the term of this patent is extended or adjusted under 35 U.S.C. 154(b) by 0 days. days.

(21) Appl. No.: 15/637,217

(22) Filed: Jun. 29, 2017

Related U.S. Application Data

(60) Provisional application No. 62/356,947, filed on Jun. 30, 2016.

(51) Int. Cl.

| | | |
|---|---|---|
| *H01L 23/52* | (2006.01) | |
| *H01L 31/0368* | (2006.01) | |
| *H01L 31/0224* | (2006.01) | |
| *H01L 31/18* | (2006.01) | |
| *H01L 31/0392* | (2006.01) | |
| *H01L 31/068* | (2012.01) | |
| *C23C 16/24* | (2006.01) | |

(52) U.S. Cl.
CPC ........ *H01L 31/03682* (2013.01); *C23C 16/24* (2013.01); *H01L 31/022425* (2013.01); *H01L 31/022466* (2013.01); *H01L 31/03921* (2013.01); *H01L 31/068* (2013.01); *H01L 31/186* (2013.01)

(58) Field of Classification Search
CPC ......... H01L 31/03682; H01L 31/03921; H01L 31/068; H01L 31/1872; C23C 16/24
See application file for complete search history.

(56) References Cited

U.S. PATENT DOCUMENTS 3,783,218 A  *  1/1974  Adams ................... C03C 27/02
                                                              219/765
5,360,745 A  *  11/1994  Sasaki .............. H01L 31/03682
                                                              136/258
(Continued)

OTHER PUBLICATIONS

Yasuda et al. "Direct electrolytic reduction of solid SiO2 in molten CaCl2 for the production of solar grade silicon" in Electrochimica Acta vol. 53, pp. 106-110. Published by Elsevier in 2007.*
(Continued)

*Primary Examiner* — Joseph C Nicely
*Assistant Examiner* — Tuan A Hoang
(74) *Attorney, Agent, or Firm* — Workman Nydegger

(57) ABSTRACT

Methods for annealing a metal foil layer to a glass layer, and/or for growing a native silicon layer in-situ therebetween. The annealing method includes applying an electrostatic (ES) field to the structure of the glass layer and the metal foil layer, with the metal foil layer positioned adjacent the glass layer, to electrostatically anneal them together. An electrostatic voltage of at least 1500 V may be applied. A seed crystal may be positioned between the glass layer and the metal foil layer prior to annealing. The method for growing a native metal (e.g., Si) layer in-situ may include applying an electrostatic voltage to the annealed structure with polarities reversed, at 1050° F. to 1100° F. Such conditions induce a redox reaction within the silica glass layer to reduce a portion of the silica, generating a layer of silicon between the glass layer and the metal foil layer.

20 Claims, 3 Drawing Sheets

(56) References Cited

U.S. PATENT DOCUMENTS

| | | | | |
|---|---|---|---|---|
| 6,417,478 B1* | 7/2002 | Shiraishi | ............ | B23K 1/0004 |
| | | | | 219/78.02 |
| 2003/0080695 A1* | 5/2003 | Ohsawa | ............ | H05B 41/2886 |
| | | | | 315/276 |

OTHER PUBLICATIONS

Nohira et al. "Pinpoint and bulk electrochemical reduction of insulating silicon dioxide to silicon" in Nature Materials vol. 2, p. 397. Published by Nature Publishing Group in 2003.*

Tang et al. "Converting SiO2 into crystalline Si for Si-based optoelectronics" in SPIE vol. 3630, p. 207. Published by SPIE in 1999.*

Liu et al. "A molten salt route for synthesis of Si and Ge nanoparticles: chemical reduction of oxides by electrons solvated in salt melt" in Journal of Materials Chemistry vol. 22, p. 5454.*

Yasuda et al. "Direct electrolytic reduction of solid SiO2 in molten CaCl2 for the production of solar grade silicon" in Electrochimic Acta vol. 53, pp. 106-110. Published by Elsevier in 2007.*

Liu et al. "A molten-salt route for synthesis of Si and Ge nanoparticles: chemical reduction of oxides by electrons solvated in salt melt" in Journal of Materials Chemistry vol. 22, p. 5454. Published by the Royal Society of Chemistry in 2012.*

"Solar Cells" on Wikipedia Retrieved from httpsL//en.wikipedia.org/w/index/php?title=Solar_cell&oldid=785553457 on Jun. 21, 2017, 11 pages.

* cited by examiner

US 10,002,980 B1

PROCESS FOR MANUFACTURE OF MONO-OR POLYCRYSTALLINE SILICON PANELS WITH ANNEALED METAL LAYER

BACKGROUND

Crystalline silicon cells have found wide usage within the solar panel industry, as well as other fields in which a photovoltaic or other crystalline silicon cell is desired.

Typical solar cells used in the solar panel industry convert light into electricity through the photovoltaic effect. A plurality of solar cells are typically incorporated into modules or arrays of such cells, e.g., to form a solar panel. A typical solar cell includes a wafer of silicon which is often grown as a monocrystalline wafer, or formed as an ingot, and then cut into a polycrystalline wafer.

Typical solar cells further typically include a metal layer on the back surface of the solar cell that serves as one of the electrodes of the solar cell. Such metal layers are typically applied as a metal paste which is then fired at high temperature in order to form the desired metal electrode on the back surface of the solar cell.

While various processes exist for the manufacture of such solar cells and the components used therein, there is a continuing need for improved methods of manufacture.

SUMMARY

Described herein are various methods and systems for manufacture of solar cells or other structures including a glass layer (or other metal oxide layer) and a metal foil layer. One embodiment relates to methods that may be used to anneal a metal layer (e.g., metal foil) to a sheet of glass. Another embodiment relates to a method that may be used produce an in-situ layer of crystalline silicon (e.g., monocrystalline or polycrystalline) from silica ($SiO_2$) glass. Such a method could be more broadly described as producing an in-situ layer of a native element from a layer of the corresponding oxide. Both such methods may be used together, with either performed first, although it may be preferred to anneal the metal foil layer to the glass, and then to subsequently produce the in-situ layer of silicon or other native element.

Such methods may be useful in the production of solar cells, or other manufacturing scenarios where it is desired to anneal a metal layer to glass, or to generate a native metal layer (e.g., silicon) from an oxide of the metal (e.g., generate Si from $SiO_2$). Annealing of a metal layer to glass may replace current production methods for solar cells. Similarly, the described methods for generating a silicon layer (or other native layer) adjacent a layer of glass or other metal oxide may replace current production methods which rely on separately produced silicon wafers. For example, the present methods may allow direct production of a silicon wafer directly from the silica glass layer itself, through a redox reaction in which an electrical plasma (arc) is used to reduce the silicon dioxide ($SiO_2$) to native silica (Si). The polarity of the electrostatic field used to anneal the metal foil layer to the glass layer may be reversed when growing the native element layer between the metal foil layer and the glass layer, as will be explained herein. Such processes allow for rapid manufacture, whereby a glass layer and a metal foil layer are provided (and a seed crystal may be disposed therebetween for later use), and an electrostatic field is applied with the cathode adjacent the glass layer to anneal the metal foil layer to the glass layer. This annealing step may be followed by another application of an electrostatic field (or electrostatic voltage) in which the polarity is reversed (this time with the anode positioned adjacent the glass layer) to induce a redox reaction within the glass layer, adjacent the seed crystal, resulting in growth of a native element layer (e.g., a layer of silicon) around the seed crystal, between the glass layer and the metal foil layer. The material for the silicon layer comes directly from the glass layer (e.g., silicon dioxide), as the silicon dioxide glass layer is reduced to elemental silicon. Such a production method can proceed very quickly, so as to be particularly suitable for mass manufacture of solar cells, or other structures where the annealed or other layers as described herein would be useful.

These and other objects and features of the present invention will become more fully apparent from the following description and appended claims, or may be learned by the practice of the invention as set forth hereinafter.

DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

I. Definitions

Figure 1:
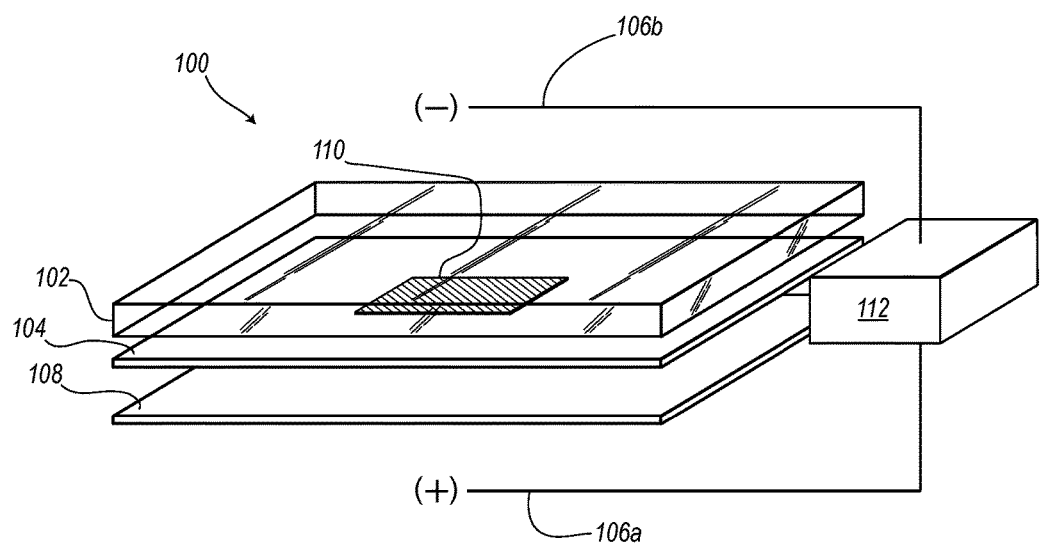
FIG. 1 is a schematic illustration of an exemplary annealing method.

All publications, patents and patent applications cited herein, whether supra or infra, are hereby incorporated by reference in their entirety to the same extent as if each individual publication, patent or patent application was specifically and individually indicated to be incorporated by reference.

It must be noted that, as used in this specification and the appended claims, the singular forms "a," "an" and "the" include plural referents unless the content clearly dictates otherwise. Thus, for example, reference to a "surfactant" includes one, two or more surfactants.

Numbers, percentages, ratios, or other values stated herein may include that value, and also other values that are about or approximately the stated value, as would be appreciated by one of ordinary skill in the art. A stated value should therefore be interpreted broadly enough to encompass values that are at least close enough to the stated value to perform a desired function or achieve a desired result, and/or values that round to the stated value. The stated values include at least the variation to be expected in a typical manufacturing or formulation process, and may include values that are within 10%, within 5%, within 1%, etc. of a stated value. Furthermore, the terms "substantially", "similarly", "about" or "approximately" as used herein represent an amount or state close to the stated amount or state that still performs a desired function or achieves a desired result. For example, the term "substantially" "about" or "approximately" may refer to an amount that is within 10% of, within 5% of, or within 1% of, a stated amount or value.

Some ranges may be disclosed herein. Additional ranges may be defined between any values disclosed herein as being exemplary of a particular parameter. All such ranges are contemplated and within the scope of the present disclosure.

II. Introduction

Described herein are methods that may be used to anneal a metal layer (e.g., metal foil) to a sheet of glass, and/or to produce an in-situ layer of crystalline silicon (e.g., monocrystalline or polycrystalline) from silica ($SiO_2$) glass. Such methods may be useful in the production of solar cells, or other manufacturing scenarios where it is desired to anneal a metal layer to glass, or to generate a native metal layer (e.g., silicon) from an oxide of the metal (e.g., generate Si from $SiO_2$). Annealing of a metal layer to glass may replace current production methods for solar cells whereby a metal paste is applied over the back surface of the solar cell, which is then fired at high temperature. The present methods for generating a silicon layer adjacent a layer of glass (e.g., sandwiched between a layer of glass and the metal foil layer) may be used to provide a silicon wafer layer, eliminating the need to acquire separately formed silicon wafers (e.g., monocrystalline wafers grown by a third party, available commercially, or polycrystalline wafers cast and cut from ingots, available commercially from a third party. The present methods allow direct production of a silicon wafer directly from the silica glass layer itself, through a redox reaction in which an electrical plasma (arc) is used to reduce the silicon dioxide ($SiO_2$) to native silica (Si), generating a relatively thin layer of silica adjacent the glass layer. In other words, the bottom surface of the glass itself may be converted (to a given thickness) from silicon dioxide to silicon through a redox reaction brought about by exposure of the glass (and adjacent metal layer) to an electrical plasma (arc).

III. Methods for Annealing Metal Foil to Glass

FIG. 1 schematically illustrates how a metal foil layer (e.g., aluminum) may be annealed to a sheet or other piece of glass. Such methods do not require preparation or application of a metal paste, but simply provide the metal foil layer (e.g., aluminum foil), the glass layer, and electrically anneal the two together, creating a strong, permanent bond therebetween. Such annealing may be achieved by applying an electrostatic (ES) field at relatively high voltage, between the glass and the metal foil layer, with the aid of a heated conductive (e.g., electrically and thermally) surface. FIG. 1 shows such a process at 100, with glass layer 102 and metal foil layer 104. The glass and metal foil layer 102, 104 are positioned between an anode 106a and a cathode 106b, with the metal foil layer positioned adjacent the heated conductive surface 108. As shown in FIG. 1, in some embodiments, a seed crystal 110 may be present, for initiating crystal formation in another process to be described below. The size of seed crystal 110 shown in the Figures is extremely exaggerated, as it may be very small relative to the size of the other layers, e.g., 0.003 $mm^2$, sandwiched between glass 102 and metal foil layer 104.

Anode 106a and cathode 106b may be energized at a voltage of at least about 1500 V, (e.g., from about 1500 V to about 3000 V, or from 1500 V to about 2700 V). A flyback transformer is an example of a structure suitable for use in generating the desired voltage and electrostatic field. FIG. 1 shows flyback transformer 112. Where a flyback transformer or the like is used to generate the desired voltage, a measurable current may be present between the primary and secondary coils of the flyback transformer, although no current of course flows on the flyback coil (as a static field is being generated). Such may be important to the creation of a standing electrical field on the negative and positive ends of the flyback, as the coil can be energized without having a channel from which to flow through. Current between the primary and secondary coils may be from about 1 A to about 5 A. A flyback transformer 112 is one example of a high voltage generator that may be suitable as a practical matter for generating the desired static electric field described herein. Any other suitable high voltage generator may be suitable for use. The flyback transformer is merely an example of such a generator, readily suitable for practical application. As when using any other variation, no current will be imposed on the system as there is nowhere for the current to be conducted to. By way of example, a Diemen HR8934 (20040922-00) was used in testing the present methods.

The anode 106a may be electrically connected to the aluminum or other metal foil layer. The voltage produced on each side of the electrical insulator (the glass) by the flyback transformer 112 creates a standing electrical field (i.e., a static electrical field). As the current cannot be passed through the glass, this static electric field pushes and/or pulls the aluminum foil towards the cathode 106b which vacuum seals the metal foil 104 to the glass 102. Where a seed crystal 110 of mono and/or poly-crystalline silicon is physically placed between the glass 102 and metal foil 104, this seed crystal becomes sealed therebetween, for later use, as will be described below.

Previous to such static electrical field sealing, heat may be applied to metal foil 104 and glass 102 (and seed crystal 110, if present), e.g., at temperatures of greater than 250° F., or at least about 260° F. (e.g., about 260° F. to about 350° F.) for a period of about 3 minutes or more (e.g., about 3 minutes to about 5 minutes). This combination of preheating, followed by application of the electrostatic field results in a strong, permanent annealing of the metal foil to the glass. Preheating and/or application of the electrostatic field during annealing of the metal foil to the glass may be performed under vacuum, or near vacuum. For example, such conditions may be under an absolute pressure of less than 50 kPa, less than 10 kPa, less than 1 kPa, less than 100 Pa, less than 10 Pa, or less than 1 Pa.

Figure 2:
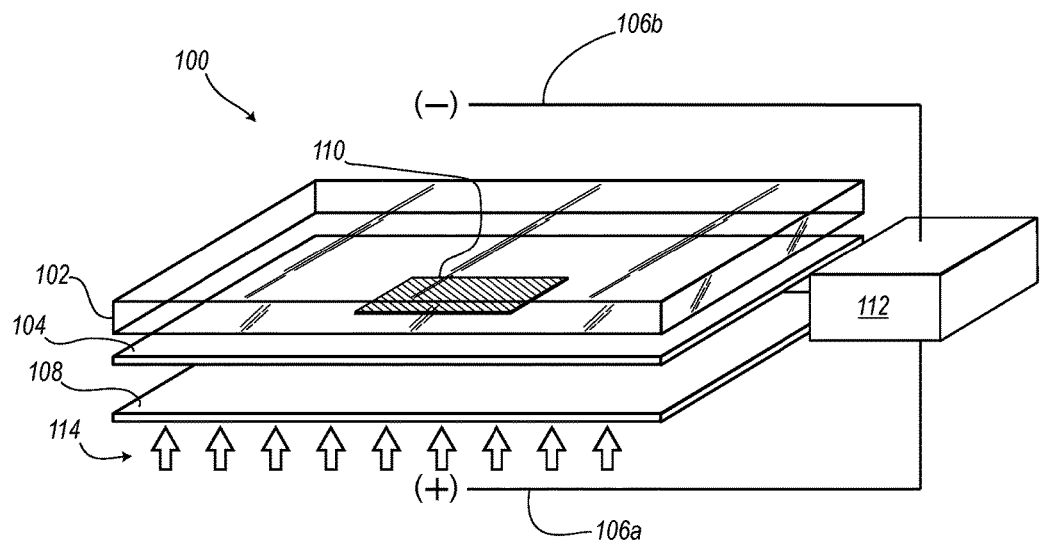
FIG. 2 is a schematic illustration of how the applied ES field presses or pulls the metal foil layer towards the glass layer.
Figure 3:
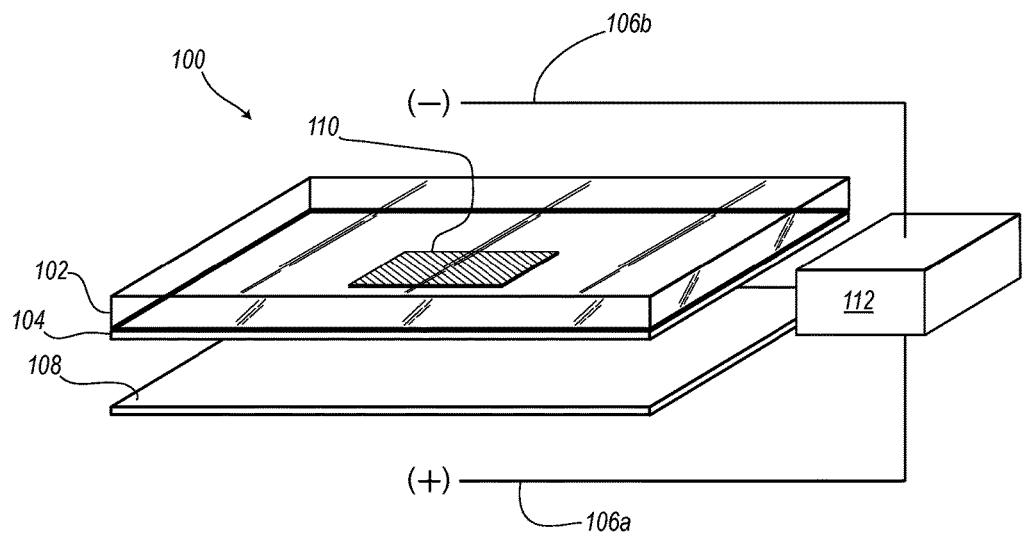
FIG. 3 is a schematic illustration showing the metal foil annealed to the glass.

The electrostatic (ES) field sealing of the metal foil 104 to the glass 102 is a fast and simple way to vacuum seal the foil 104 to the glass 102. The foil 104 may be vacuumed to the glass as a preliminary step in order for the secondary, high temperature annealing process (described further below) to take place at the specified temperatures. FIG. 2 illustrates application of the electrostatic field 114, which presses the metal foil layer 104 against the glass 102. FIG. 3 shows the result after application of the ES field 114 and vacuum, ensuring a good bond between the metal foil 104 and the glass 102.

IV. Methods for Producing Crystalline Si from Glass by Redox

Figure 4:
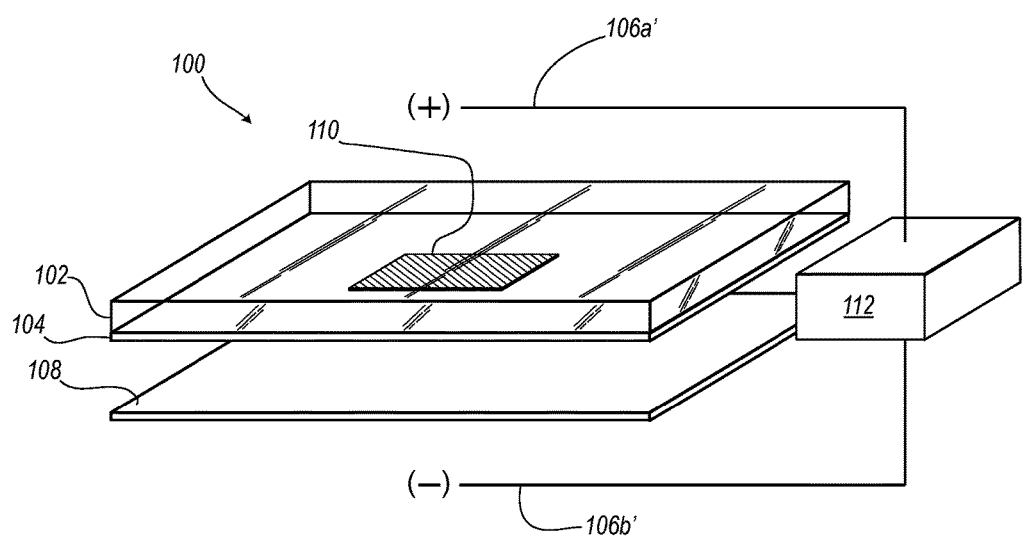
FIG. 4 is a schematic illustration showing the annealed structure, with the poles having been reversed, and a second electrostatic field being applied, to induce growth of a native element layer between the glass or other metal oxide layer and the metal foil layer, by reducing some of the metal oxide to native metal (e.g., $SiO_2$ to Si)
Figure 5:
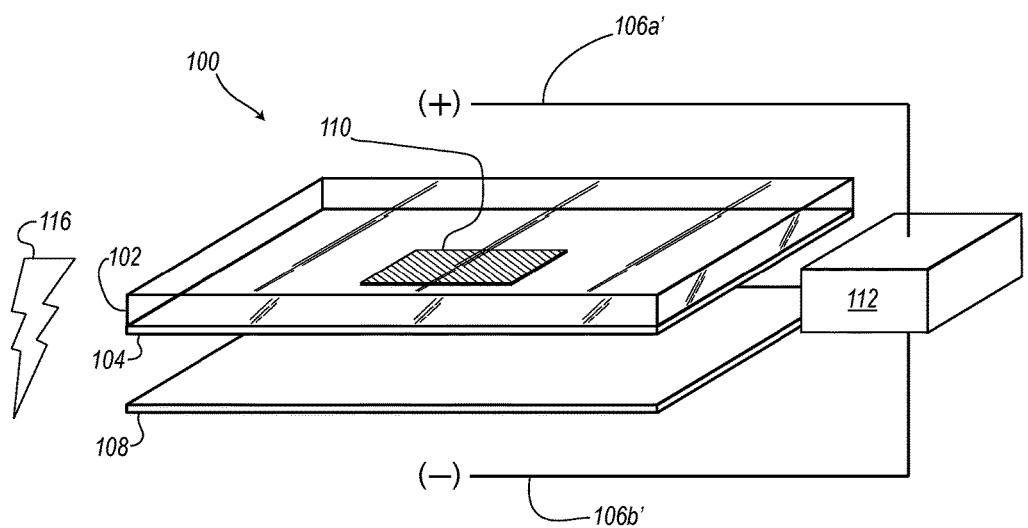
FIG. 5 is a schematic illustration showing generation of the electrical arc, which is associated with the growth shown in FIG. 4.

Before the process of high temperature annealing of metal foil 104 to glass 102 a small seed of monocrystalline or polycrystalline silicon 110 may have been placed between the glass 102 and metal foil 104. This seed crystal 110 serves as a point from which generation of a native silicon layer can be formed between the glass 102 and the metal foil layer 104. In other words, the seed 110 will be the first area or region from which a redox reaction (the reduction of the oxide) via an electrical arc is intended to take place, between the anode 106a and the cathode 106b, across the sandwich of the metal foil 104 and glass 102. This occurs as the temperature is raised to temperature of greater than 1000° F., e.g., at least about 1050° F. (e.g., a range from about 1050° F.-1100° F.), to allow the glass to become more conductive, less prone to cracking, and resistant to development of other deformities that may be more likely to occur at lower temperatures. During this second high temperature annealing step (i.e., after the first ES annealing applied by the flyback transformer), the polarity of the electrodes 106a and 106b may be reversed as shown in FIG. 4 (so that the anode now shown on top, is 106a', and the cathode, now shown on bottom, is 106b'), and an electrical arc is generated. FIG. 5 illustrates generation of the electrical arc 116.

The anode 106a' performs the reduction of the oxide (i.e., reducing $SiO_2$ to Si) at voltages similar to those described above in conjunction with FIG. 1, e.g., at least about 1500 V (e.g., from about 1500 V to about 3000 V, or from about 1500 V to about 2700 V). The temperature associated with this redox reaction is greater than 1000° F., e.g., from about 1050° F. to about 1100° F. The temperature may be maintained below a melting point of any of the components within the assembly being treated. For example, aluminum has a melting point of 1221° F.

The anode 106a' may be positioned at a location that is near, but separated from the glass 102. For example, the anode 106a' may be at least about 0.5 mm away from glass 102, e.g., from about 1 mm to about 3.5 mm above the glass. The time period over which the voltage is applied may be relatively short, e.g., from 0.5 second to about 5 seconds, or from about 1 second to 2 seconds. Such a short period and the described temperatures will be configured to leave the metal foil intact. It will be apparent that the short treatment times for annealing the metal foil to the glass, and for growing the silicon crystal structure between the glass and metal foil layer are sufficiently short so as to be easily used in mass production techniques.

Figure 6:
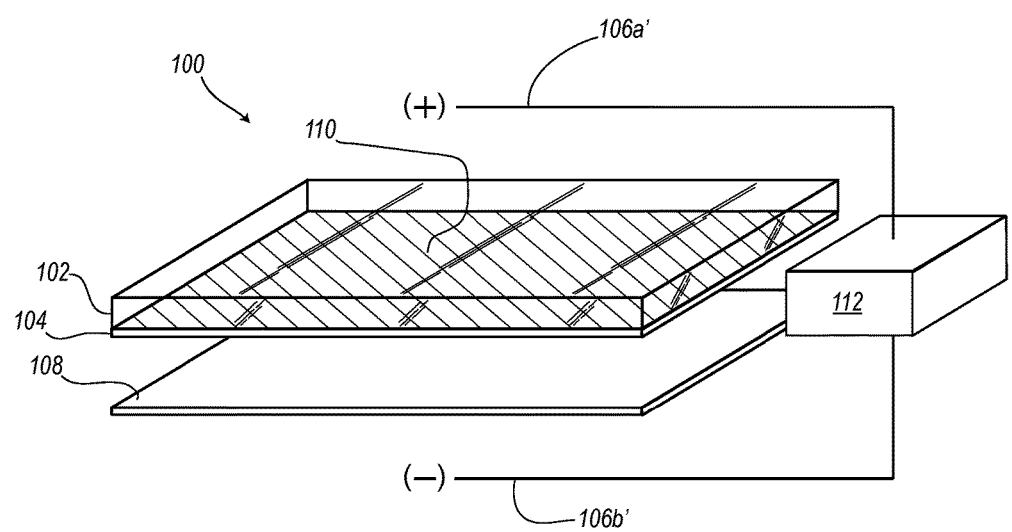
FIG. 6 is a schematic illustration showing the resulting structure, after growth of the native element layer between the glass and the metal oxide layer.

After the high temperature annealing or treatment process is finished, silicon 118 having a crystalline structure as grown from the seed crystal will be grown right above the position of metal foil 104 (i.e., between the metal foil 104 and the glass 102), as shown in FIG. 6. Where the seed 110 is monocrystalline silicon, the resulting silicon layer 118 that is formed as a redox reaction product from the glass layer (SiO2) will similarly exhibit a substantially monocrystalline structure. Where the seed 110 is polycrystalline silicon, a polycrystalline silicon layer 118 results. The monocrystalline silicon or polycrystalline silicon layer 118 is thus sandwiched between the aluminum or other metal foil layer 104, and the glass layer 102, and is fused therewith.

This second process (the redox reaction) may be thought of as somewhat analogous to the electrolysis of water, where oxygen and hydrogen are chemically separated, as the oxygen is separated at the anode and hydrogen at the cathode, but in the present case the cathode (the negative lead) is vacuum sealed to not allow any hydrogen to form or be separated, which then allows only oxygen to be released or separated from the anode. This reduction of $SiO_2$ sourced from the glass layer leaves a substantially pure sheet or layer of crystalline silicon on the surface of the cathode (e.g., the metal foil), at the interface between the metal foil layer 104 and the glass layer 102.

The silicon layer 118 thus formed is relatively thin, e.g., far thinner than existing separate silicon wafers typically used in manufacture of solar cells (which are typically well over 100 microns thick). For example, the silicon layer 118 may have a thickness from about 5 to about 50 microns, from about 5 to about 20 microns, from about 5 to about 10 microns, e.g., typically from about 5 to about 9.5 microns. Furthermore, will be apparent that the silicon layer 118 is formed in-situ, so that no cutting of wafers (as is typically done in at least the case of polycrystalline silicon wafers) is required, greatly simplifying the assembly and manufacture process. Furthermore, it will be apparent that little or no reagent chemical agents are typically required in the process, but rather the simple application of vacuum conditions, an electrostatic field, at a desired temperature. Such methods greatly reduce the need for chemical reagents and production of waste chemicals often generated in the production of solar cell components.

As noted above, the duration of the second, high temperature annealing step may typically be about 1 to about 2 seconds to perform the redox reaction, although this can take longer over a larger area, as needed. For example, the exemplary time periods may be for a small area, such as for an area of about $\frac{1}{32}^{nd}$ $inch^2$ (e.g., a square about 3/16 inch on each side, or a circle with about a 3/16 inch diameter). The process can of course be scaled up for use with much larger dimensioned metal foil layers, glass sheets, and silicon layers, e.g., to be similar to those currently provided in standard sized solar cells. For example, such cells may typically have dimensions of 100 to 200 mm (either as a diameter or length of a side of a square). Relatively small cells (e.g., only about 1 $in^2$ in area) may also be used, where such "micro" cells may be coupled together in series and/or parallel as will be appreciated, to produce a desired solar panel.

In the testing conducted, the area involved may have been relatively small (e.g., less than 1 $in^2$. Typical dimensions of the glass, metal foil, and seed crystals being used may include:

Aluminum 1 $in^2$ area, thickness 0.01 mm (e.g., 0.005-0.02 mm)

Glass 1 $in^2$ area, 1.05-2.5 mm, for production pieces to reduce cracking

Seed Crystal 0.003 $mm^2$ area, 0.0006 mm or larger. (Placed ideally on the glass prior to the placement of the aluminum metal foil layer adjacent to the glass)

While described principally in the context of aluminum metal foil, as aluminum would be relatively inexpensive and otherwise suitable, it will be appreciated that other metal foil materials could be used (e.g., nickel, copper, combinations of more than one material, alloys thereof, etc.). In addition, it will be appreciated that other forms of metal oxide (other than $SiO_2$) could similarly be reduced according to the present techniques to reduce any such metal oxide to native metal, for any desired use or application.

Such structures as described herein have the necessary features for further fabrication into a solar cell. Doping of the silicon layer, if desired to provide desired n-type and p-type layers therein can be achieved using any suitable methods that will be apparent to those of skill in the art. By way of example, in one embodiment, because of the electrical junctions and polarization through the plasma (the glass is also polarized in the above process), doping is not actually absolutely necessary to create a relatively efficient solar cell or panel. That said, it is possible to dope, if desired. For example, to dope the p-junction, a micro-film (dopant) may be placed with the seed crystal, as at the presently contemplated temperatures where the silica glass is reduced to silicon, the material is somewhat permeable, fluid, or "aqueous", and the dopant film may be dissolved substantially evenly into the silicon layer. This process would occur at the time that the glass is reduced to silicon. In other words, the glass layer, the dopant micro film, and the aluminum or other metal foil layer may be placed in that sequence (e.g., top to bottom). The dopant preferably has a relatively low melting point, as it is intended to become part of the solution (as the $SiO_2$ of the glass becomes somewhat fluidic or "aqueous" at such elevated temperatures) when annealing the foil to the glass. The dopant will be sandwiched between the two (with the seed crystal on either side of the dopant). After processing, the dopant fully dissolves into the silicon when the reduction to oxidation occurs (when the polarity is flipped, using high voltage and high heat to perform the redox reaction).

Another more elaborate process is possible, involving the above described process to create a p-junction. After reducing the silica glass to silicon, the metal layer annealed to the silicon/glass wafer could be dissolved (e.g., using an appropriate chemical solution), and a thin film dopant could be applied at high temperature (e.g., depending on dopant, but generally from about 450° F. to about 700° F.), and a metal contact/back reflector layer (e.g., aluminum) could be reapplied (e.g., using the same annealing process described herein). In other words, one may take the completed item F described above including a dopant therein, dissolve the foil that is present on the glass to anneal another micro film (e.g., to provide an n-junction, annealed via the same process), and then finally the back-reflector metal foil layer may be annealed (in any desired fashion) to the back of the wafer/silicon structure. Application of such doped p or n junctions or layers would not require a large or thick doping film, as the dopant concentration is only typically about 1 ppm (e.g., from 0.1 ppm to 10 ppm) relative to the silicon in the native silicon layer. Thus, at least 3 possibilities exist—to not use any dopant, to create a p-layer only, or to create a p-n junction coupled with a back layer reflector. Other possibilities may be apparent to those of skill in the art in light of the present disclosure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A manufacturing process for annealing a metal layer to a silica glass layer and then growing a native silicon layer in-situ, between the metal foil layer and the glass layer, the process comprising:
   providing a silica glass layer;
   providing a metal foil layer; and
   providing a seed crystal of silicon between the silica glass layer and the metal foil layer; and
   applying an electrostatic field to the silica glass layer with the metal foil layer adjacent the glass layer to electrostatically anneal the metal foil layer to the glass layer, wherein the electrostatic field is generated with a cathode disposed adjacent the silica glass layer and an anode disposed adjacent the metal foil layer to press or pull the metal foil layer against the silica glass layer, annealing it thereto, with the seed crystal sealed therebetween;
   applying an electrostatic voltage to the silica glass layer, the seed crystal, and the metal foil annealed to the silica glass layer with a polarity reversed, so that the electrostatic voltage is generated with an anode disposed adjacent the silica glass layer and a cathode disposed adjacent the metal foil layer, at a temperature in a range of 1050° F. to 1100° F., the electrostatic voltage inducing a redox reaction within the silica glass layer so as to reduce a portion of the silica glass layer, generating a layer of silicon between the silica glass layer and the metal foil layer, wherein the electrostatic voltage is in a range from 1500 V to 2700 V.

2. The process of claim 1, wherein the layer of silicon generated between the silica glass layer and the metal foil has a thickness from 5 µm to 20 µm.

3. The process of claim 1, wherein the metal foil layer comprises aluminum foil, and the anode during application of the electrostatic voltage is positioned at a distance in a range of 0.5 mm to 3.5 mm from the silica glass layer.

4. The process of claim 1, further comprising preheating at least one of the silica glass layer or metal foil layer to a temperature greater than 250° F.

5. The process of claim 4, wherein the preheating is to a temperature within a range of 260° F. to 350° F.

6. The process of claim 4, wherein the preheating of the silica glass layer or the metal foil layer is achieved with a heated conductive surface.

7. The process of claim 4, wherein the preheating is achieved at an absolute pressure of less than 50 kPa.

8. The process of claim 4, wherein the preheating is achieved at an absolute pressure of less than 10 kPa.

9. The process of claim 4, wherein the preheating is achieved at an absolute pressure of less than 1 kPa.

10. The process of claim 1, wherein the electrostatic field is generated by a flyback transformer.

11. The process of claim 1, wherein the seed crystal comprises at least one of monocrystalline silicon or polycrystalline silicon.

12. The process of claim 1, wherein the metal foil layer comprises aluminum.

13. The process of claim 1, wherein the anode during application of the electrostatic voltage is positioned at a distance in a range of 0.5 mm to 3.5 mm from the silica glass layer.

14. The process of claim 1, wherein a time period over which the electrostatic voltage is applied is from 0.5 second to 5 seconds.

15. The process of claim 1, wherein a time period over which the electrostatic voltage is applied is from 1 second to 2 seconds.

16. The process of claim 1, wherein the layer of silicon generated between the silica glass layer and the metal foil has a thickness from 5 μm to 50 μm.

17. The process of claim 1, wherein the layer of silicon generated between the silica glass layer and the metal foil has a thickness from 5 μm to 10 μm.

18. The process of claim 1, further comprising positioning a dopant micro film with the seed crystal, between the silica glass layer and the metal foil layer.

19. A manufacturing process for annealing a metal layer to a silica glass layer and then growing a native silicon layer in-situ, between the metal foil layer and the glass layer, the process comprising:
  providing a silica glass layer;
  providing a metal foil layer;
  applying an electrostatic field to the silica glass layer with the metal foil layer adjacent the glass layer to electrostatically anneal the metal foil layer to the glass layer, wherein the electrostatic field is generated with a cathode disposed adjacent the silica glass layer and an anode disposed adjacent the metal foil layer to press or pull the metal foil layer against the silica glass layer, annealing it thereto; and
  applying an electrostatic voltage to the silica glass layer and the metal foil annealed to the silica glass layer with a polarity reversed, so that the electrostatic voltage is generated with an anode disposed adjacent the silica glass layer and a cathode disposed adjacent the metal foil layer, at a temperature greater than 1000° F., but below a melting point of both the silica glass layer and a melting point of the metal layer, the electrostatic voltage inducing a redox reaction within the silica glass layer so as to reduce a portion of the silica glass layer, generating a layer of silicon between the silica glass layer and the metal foil layer, wherein the electrostatic voltage is at least 1500 V.

20. The process of claim 19, further comprising positioning a seed crystal between the silica glass layer and the metal foil layer prior to annealing the metal foil layer to the silica glass layer.

* * * * *